United States Patent
Ikeda et al.

(10) Patent No.: US 6,589,449 B2
(45) Date of Patent: Jul. 8, 2003

(54) HIGH-MELTING-POINT CONDUCTIVE OXIDE, METHOD OF MANUFACTURING THE SAME, AND HIGH-TEMPERATURE ELECTRICALLY CONDUCTIVE MATERIAL BASED ON THE OXIDE

(75) Inventors: Shinichi Ikeda, c/o Electrotechnical Laboratory, Agency of Industrial Science & Technology, 1-4 Umezono 1-chome, Tsukuba-shi, Ibaraki (JP); Naoki Shirakawa, Tsukuba (JP); Hiroshi Bando, c/o Electrotechnical Laboratory, Agency of Industrial Science & Technology, 1-4 Umezono 1-chome, Tsukuba-shi, Ibaraki (JP)

(73) Assignees: National Institute of Advanced Industrial Science and Technology, Tokyo (JP); Shinichi Ikeda, Tsukuba (JP); Hiroshi Bando, Tsukuba (JP)

( * ) Notice: Subject to any disclaimer, the term of this patent is extended or adjusted under 35 U.S.C. 154(b) by 0 days.

(21) Appl. No.: 09/749,949

(22) Filed: Dec. 29, 2000

(65) Prior Publication Data

US 2001/0050355 A1 Dec. 13, 2001

(30) Foreign Application Priority Data

Jun. 7, 2000 (JP) ........................................ 2000-170889

(51) Int. Cl.[7] ........................... H01B 1/08; H01L 29/06; H01L 29/04; C01F 11/02; C01F 55/00; C30B 29/22; G01K 7/00

(52) U.S. Cl. ............. 252/519.13; 252/514; 252/519.13; 252/509; 423/22; 423/155; 423/583; 117/938; 338/22 SD; 338/32 S; 429/209; 429/46; 374/136; 374/179; 257/22

(58) Field of Search ............................ 252/518.1, 520.3, 252/500; 505/101; 23/295 R; 423/583, 22, 155; 422/245.1; 501/123.1; 117/938; 338/22 SD, 32 S; 429/209, 46; 374/136, 179; 257/22, 32, 43, 50; 264/109, 239

(56) References Cited

U.S. PATENT DOCUMENTS 5,310,706 A * 5/1994 Litchenberg et al. ......... 257/35

FOREIGN PATENT DOCUMENTS

| JP | 04-104935 | 4/1992 | ........... C04B/35/00 |
| JP | 2000-044390 | 3/2000 | ........... C03B/29/16 |
| JP | 2000-128638 | 5/2000 | ......... C04B/35/495 |

OTHER PUBLICATIONS

Randall et al., "The Preparation of Some Ternary Oxides of Platinum Metals", J. Am. Chem. Soc. (1959), V81, pp 2629–2631.*

* cited by examiner

Primary Examiner—Mark Kopec
Assistant Examiner—Kallambella Vijayakumar
(74) Attorney, Agent, or Firm—Oblon, Spivak, McClelland, Maier & Neustadt, P.C.

(57) ABSTRACT

A high-melting-point conductive oxide includes a mixture of a powdered Sr compound and Ru compound and/or Ru metal. The mixture is sintered at a primary temperature of 900° C. to 1300° C. in an atmosphere containing oxygen to form a sintered body that is pulverized back to a powder. The powder is given a desired shape that is again sintered, this time at a secondary temperature of 1000° C. to 1500° C. higher than the primary temperature, again in an atmosphere containing oxygen. The high-melting point conductive oxide is used as a heating element for high-temperature use, an electrode material for high-temperature use, a material for high-temperature thermocouple use and a light-emitting material for high-temperature use.

18 Claims, 1 Drawing Sheet

HIGH-MELTING-POINT CONDUCTIVE OXIDE, METHOD OF MANUFACTURING THE SAME, AND HIGH-TEMPERATURE ELECTRICALLY CONDUCTIVE MATERIAL BASED ON THE OXIDE

BACKGROUND OF THE INVENTION

1. Field of the Invention

The present invention relates to a high-melting-point conductive oxide, to a method of manufacturing the oxide, and to a high-temperature electrically conductive material used to form high-temperature heat-generating materials, such as heating elements for generating high temperatures in electric furnaces and the like, electrode material capable of being used at high temperatures, high-temperature light-emitting material including filament material for lamps and the like, and high-temperature thermocouple material and the like, utilizing heat produced when a current is passed through the oxide in an atmosphere containing oxygen.

2. Description of the Prior Art

Electric furnaces that utilize resistance-heating employ a heating element material selected for that purpose. In air or an atmosphere including an oxygen, silicon carbide (SiC) heating elements can be used to obtain temperatures in the order of 1600° C., and molybdenum disilicide ($MoSi_2$) heating elements can be used to obtain temperatures up to around 1700° C. Platinum (Pt) or platinum-rhodium (Pt—Rh) metal wire has a melting point of 1769° C., and can be used for electric furnaces that go up to 1500° C. Including the temperature dependency, the electrical resistivity of these heating elements is more or less metal-like. Heating elements of lanthanum-chromite, an oxide of lanthanum and chromium, has a semiconductor-like temperature dependency, but because of the material's relatively low electrical resistance, can be used to form general-purpose electric furnaces capable of obtaining temperatures of up to 1900° C.

To obtain higher temperatures with resistance-heating methods, zirconia ($ZrO_2$) or thoria ($ThO_2$) having a melting point or decomposition temperature of 2000° C. or more is used. Since these oxides are semiconductors, current flow can only occur at high temperatures of at least 1000° C. That is, since they have to be used in conjunction with other heating elements with metal-like resistivity, general-purpose electric furnaces that use these oxides as heating elements have not yet been realized. In hydrogen or an inert gas or other reducing atmosphere, the high-melting-point metals of molybdenum (Mo), tantalum (Ta) and tungsten (W) can be used to obtain high temperatures of up to 2000, 2100 and 2500° C., respectively. In the presence of very small amounts of oxygen ($10^{-5}$ Torr or more), these heating elements readily form oxides, increasing their electrical resistance. For this reason, they cannot be used in an oxygen atmosphere.

Noble metals such as ruthenium (Ru), iridium (Ir) and rhodium (Rh) have high melting points (ruthenium: 2250° C.; iridium: 2457° C.; rhodium: 1963° C.). However, in an oxidizing atmosphere, at high temperatures these metals readily vaporize or oxidize. Moreover, the fact that they are noble metals mean that they are very expensive, costing four or five times more than gold, and they are not easy to machine, all of which makes it very difficult in practice to use them as heating element materials.

JP-A-HEI 6-223960 discloses high-frequency heating elements formed of oxides of ruthenium, iridium, rhodium or other elements. The invention of this disclosure has as its object the use of microwave absorption for heating applications such as microwave ovens and the like, and is characterized in that when the above materials are used to form heating elements for high-frequency heating, the materials exhibit good temperature elevation characteristics. The materials are intended for use at around 600° C. to 870° C., which is not the same as materials intended to be used at temperatures in the order of 2000° C.

Previously, resistance-heating to temperatures of 2000° C. or higher has only been possible using heating elements of tungsten or other such high-melting-point metal in a reducing atmosphere of hydrogen or an inert gas or the like. There have not been any suitable materials, that could be used in an oxidizing atmosphere, having a melting point in the order of 2000° C. and metal-like electrical resistivity. Therefore, there has not been a practical electric furnace capable of achieving a temperature of 1700° C. or higher. In other words, there has been no method of generating a high temperature of at least 1700° C. utilizing resistance-heating in an oxidizing atmosphere. Similarly, there has no thermocouple material to measure a temperature of 1700° C. or more. However, if there were a material having a metal-like low electrical resistance and a melting point of around 2000° C. in an oxidizing atmosphere, it would be possible to provide a method of resistance-heating at a previously unattainable temperature range, and it would also be possible to use a thermocouple to measure such high temperatures.

An object of the present invention is therefore to provide a high-temperature electrically conductive material that can be used for heating elements, electrode material, thermocouple material, light-emitting material and other such materials in an electric furnace that can be used in an oxidizing atmosphere at a high temperature of 1700° C. or more.

Another object of the present invention is to provide a high-melting-point electrically conductive oxide constituting the high-temperature electrically conductive material, and a method of manufacturing the same.

SUMMARY OF THE INVENTION

To attain the above object, the present invention provides a high-melting-point conductive oxide that is a Sr—Ru oxide comprising a mixture of a powdered Sr compound and Ru compound or Ru metal that is sintered at 900° C. to 1300° C. in an atmosphere containing oxygen to form a sintered body that is pulverized to a powder, shaped and again sintered at 1000° C. to 1500° C. in an atmosphere containing oxygen.

The above object is also attained by a high-melting-point conductive oxide that is a Sr—Ru oxide comprising a mixture of powdered $SrCO_3$ and $RuO_2$ that is sintered at 900° C. to 1300° C. in air to form a sintered body that is pulverized to a powder, shaped and again sintered at 1000° C. to 1500° C. in air.

The above object is also attained by a high-melting-point conductive oxide that is a Sr—Ru oxide single-crystal comprising a Sr—Ru oxide obtained as described above that is melted by concentrated infrared radiation or the like and recrystallized.

The present invention also includes the oxide and oxide single-crystal in which a molar ratio between the $SrCO_3$ and the $RuO_2$ is 2:1.

The above object is also attained by a method of manufacturing the high-melting-point conductive oxide, the method comprising mixing together powdered $SrCO_3$ and $RuO_2$ to form a mixture, sintering the mixture in air at 900° C. to 1300° C. to form a sintered body, pulverizing the sintered body to a powder, shaping the powder, and sintering the shaped powder in air at 1000° C. to 1500° C.

The present invention also includes a method of manufacturing the Sr—Ru oxide single-crystal by using focused infrared radiation or the like to melt the Sr—Ru oxide obtained as described above, and recrystallizing the melted oxide.

The present invention also provides high-temperature heating elements, high-temperature electrode material, light-emitting material and high-temperature thermocouple material comprised of the oxide or single-crystal for use in an atmosphere containing oxygen.

As described in the foregoing, as a material for use as heating elements, electrode material, light-emitting material and thermocouple material, of all the conductive oxides, there is used an oxide or single-crystal containing Sr and Ru, which in an atmosphere containing oxygen has the highest melting point and exhibits metal-like electrical resistance up to temperatures close to the highest melting point. The result is material properties that do not undergo change even at 2000° C. and can effect, for the first time, formation of oxidizing atmospheres at 2000° C. and measurement of temperatures in oxidizing atmospheres at 2000° C.

The above and other objects, further features of the invention, its nature and various advantages will be more apparent from the accompanying drawings and following detailed description of the invention.

DESCRIPTION OF THE PREFERRED EMBODIMENT

Figure 1:
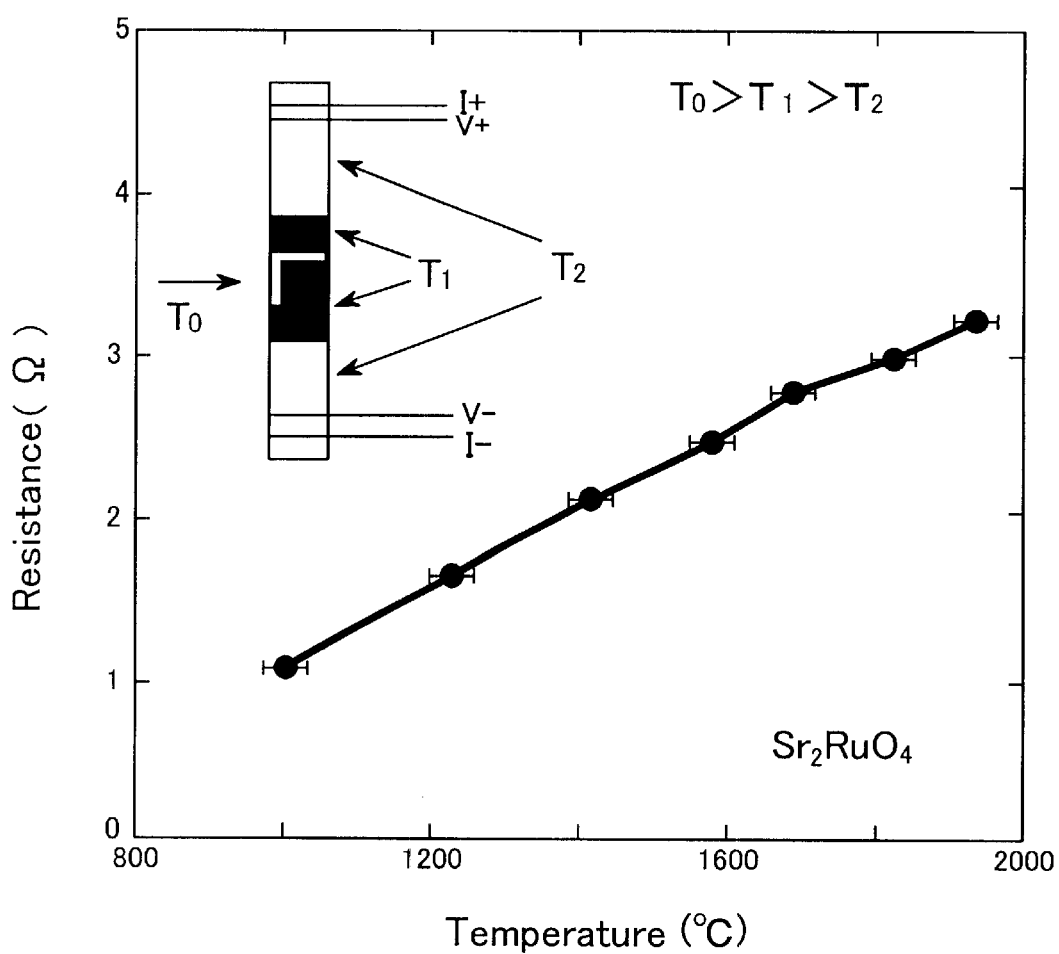
FIG. 1 is a diagram illustrating the relationship between electrical resistance and temperature of a bar of $Sr_2RuO_4$ oxide of the present invention.

As a result of studies, the present inventors discovered that among conductive oxides, Sr—Ru oxides had the highest melting point and, in atmospheres containing oxygen, exhibited metal-like electrical resistance at temperatures of up to around 2000° C. The present invention is based on this discovery, and relates to a Sr—Ru oxide comprising a mixture of a powdered Sr compound and Ru compound or Ru metal that is sintered at 900° C. to 1300° C. in an atmosphere containing oxygen to form a sintered body, that is then pulverized to a powder, shaped, and again sintered, at 1000° C. to 1500° C., in an atmosphere containing oxygen.

The strontium compound and ruthenium compound starting materials were used in the form of a carbonate ($SrCO_3$) and an oxide ($RuO_2$), but can be used in any form. It is preferable to use a powder having a particle size ranging from a few ten to a few hundred micrometers, but the particle size is not critical provided the powders are well mixed. This also applies to the particle size distribution. The proportion of the two components is determined based on what the resultant oxide is to be used for.

The preferred sintering temperature is from 900° C. to 1300° C. This is because a temperature lower than 900° C. will not decompose the starting $SrCO_3$ material, while a temperature over 1300° C. will cause vaporization of the starting $RuO_2$ material, changing the composition. The sintering time will normally be within the range of two to 24 hours. The sintered body obtained by the above sintering is then pulverized to a powder, mixed, and press-formed to a required shape. The particle size of the powder ranges from a few ten to a few hundred micrometers. The formed body is then sintered for two to six hours at a temperature ranging from 1000° C. to 1500° C., that is to be higher than the primary sintering temperature. This secondary sintering is done to substantially bind the particles of the two materials, increase the strength of the oxide thus obtained and facilitate the workability.

The resultant oxide has a metal-like electrical resistance that shows virtually no change up to the melting point of 2100° C. This is because even though the material is melted and recrystallized, the oxide thus obtained has the same composition, which does not change up to the melting point. Forming the thus-obtained oxide into a single-crystal reduces the electrical resistivity by two orders of magnitude and increases the strength. The oxide may be formed into a single-crystal by a known method whereby the oxide is melted and recrystallized, or is formed into a thin film and recrystallized, or other such method.

The ultrahigh-melting-point conductive oxide or single-crystal thus obtained is basically composed of $Sr_2RuO_4$, $Sr_3Ru_2O_7$ or $SrRuO_3$ or the like. Provided the object can be attained, a known heat-resistant material can be incorporated as a separate phase. The ultrahigh-melting-point conductive material of this invention can be used in an oxidizing atmosphere at up to around 2000° C., and it is to be understood that it can of course also be used in a reducing atmosphere. When the needs of the intended application require that the oxide have a large volume, it can be formed as a polycrystal. When just a few millimeters or less is enough, it can be used as a single-crystal or in the form of a thin film.

As described in the foregoing, the Sr—Ru oxide of this invention has the highest melting point among conductive oxides and in an atmosphere containing oxygen exhibits metal-like electrical resistance at up to 2000° C. This makes the oxide applicable for use as a resistance-heating element that in an atmosphere containing oxygen can generate high temperatures of 1700° C. and over, and in such an oxygen-containing atmosphere can be used as a high-temperature electrode material and as a light-emitting material. The Sr—Ru oxide can also be used as a thermocouple material, making it possible to measure high temperatures of 1700° C. or more in an oxidizing atmosphere.

Examples of the present invention will now be described. However, it is to be understood that the invention is not limited to the following examples.

EXAMPLE 1

(Manufacture of $Sr_2RuO_4$ oxide)

$SrCO_3$ and $RuO_2$ were put together at a molar ratio of 2:1 and thoroughly mixed, using an agate mortar, and sintered in air for 24 hours at 1200° C. The sintered body thus formed was pulverized to a powder that was press-formed into the shape of a bar 6 mm in diameter and 200 mm in length. This was sintered for three hours in air at 1300° C., resulting in a bar-shaped $Sr_2RuO_4$ oxide.

EXAMPLE 2

(High-temperature electrical characteristics of $Sr_2RuO_4$ oxide)

The bar of $Sr_2RuO_4$ oxide prepared in Example 1 was placed in an air atmosphere in an infrared image furnace equipped with a halogen lamp and an elliptical mirror. To measure the electrical resistance, silver paste was used to affix terminals to each end of the oxide bar, and a radiation thermometer was used to measure the temperature at the portion $T_0$ heated to the highest temperature by the focused infrared rays. In this state, a digital multimeter was used to measure the electrical resistance by the 4-terminal method while raising the lamp voltage. The $Sr_2RuO_4$ started to melt when the temperature reached roughly 2100° C. As can be seen from FIG. 1, electrical resistivity rose with the elevation of the temperature, but up to the melting point stayed at a metal-like value of between 1 and 3 ohms.

In FIG. 1, I+ and I− are current terminals, and V+ and V− are voltage terminals. The temperature was not the same over the whole bar of oxide. The portion at which the concentration of infrared rays produced the highest temperature was the center of the oxide, and it was the temperature $T_0$ at this point that was measured. The temperature was plotted along the horizontal axis of the graph. The temperature decreased as the distance from the center of the oxide increased, so that $T_0 > T_1 > T_2$. Thus, it was revealed that up to a high temperature of around 2000° C., the $Sr_2RuO_4$ could be used as a resistance-heating element in an oxidizing atmosphere. It was also revealed that in an oxidizing atmosphere the $Sr_2RuO_4$ could be used as a high-temperature electrode material, a thermocouple material, and a lamp filament that emits light when a current is passed therethrough.

EXAMPLE 3
(Manufacture of $Sr_2RuO_4$ single-crystal)

As in Example 2, a bar of $Sr_2RuO_4$ oxide was placed in an air atmosphere in an infrared image furnace equipped with a halogen lamp and a rotating elliptical reflecting mirror. The oxide bar was suspended from the upper part of the furnace, and the lamp voltage was increased to heat the lower end of the oxide bar to 2100° C. to melt the oxide. The end was then brought into contact with a bar of the same oxide material fixed in position in the lower part of the space, to thereby maintain the melted portion. The lamp was then raised at a speed of 20 mm/h, moving the melted portion slowly upwards, obtaining $Sr_2RuO_4$ oxide through recrystallization.

What is claimed is:

1. A Sr—Ru conductive oxide comprising a sintered body made from a mixture of a powdered Sr compound, a powdered Ru compound and a Ru metal, wherein the sintered body is stable up to a melting temperature of the sintered body higher than 1700° C. in an oxygen-containing atmosphere.

2. A heating element formed of a Sr—Ru conductive oxide comprising a sintered body made from a mixture of a powdered Sr compound and one of a powdered Ru compound and a Ru metal, wherein the sintered body is stable up to a melting temperature of the sintered body higher than 1700° C. in an oxygen-containing atmosphere.

3. An electrode formed of a polycrystalline Sr—Ru a conductive oxide comprising a sintered body made from a mixture of a powdered Sr compound and one of a powdered Ru compound and a Ru metal, wherein the sintered body is stable up to a melting temperature of the sintered body higher than 1700° C. in an oxygen-containing atmosphere.

4. A thermocouple formed of a Sr—Ru conductive oxide comprising a sintered body made from a mixture of a powdered Sr compound and one of a powdered Ru compound and a Ru metal, wherein the sintered body is stable up to a melting temperature of the sintered body higher than 1700° C. in an oxygen-containing atmosphere.

5. A light emitter formed of a Sr—Ru conductive oxide comprising a sintered body made from a mixture of a powdered Sr compound and one of a powdered Ru compound and a Ru metal, wherein the sintered body is stable up to a melting temperature of the sintered body higher than 1700° C. in an oxygen-containing atmosphere.

6. A Sr—Ru conductive oxide comprising a single crystal body grown from a melt of a sintered body of Sr—Ru conductive oxide made from a mixture of a powdered Sr compound, a powdered Ru compound and a Ru metal, wherein the single crystal body is stable up to a melting temperature of the sintered body higher than 1700° C. in an oxygen-containing atmosphere.

7. A heating element formed of a Sr—Ru conductive oxide comprising a single crystal body grown from a melt of a sintered body of Sr—Ru conductive oxide made from a mixture of a powdered Sr compound and one of a powdered Ru compound and a Ru metal, wherein the single crystal body is stable up to a melting temperature of the sintered body higher than 1700° C. in an oxygen-containing atmosphere.

8. A thermocouple formed of a Sr—Ru conductive oxide comprising a single crystal body grown from a melt of a sintered body of Sr—Ru conductive oxide made from a mixture of a powdered Sr compound and one of a powdered Ru compound and a Ru metal, wherein the single crystal body is stable up to a melting temperature of the sintered body higher than 1700° C. in an oxygen-containing atmosphere.

9. A light emitter formed of a Sr—Ru conductive oxide comprising a single crystal body grown from a melt of a sintered body of Sr—Ru conductive oxide made from a mixture of a powdered Sr compound and one of a powdered Ru compound and a Ru metal, wherein the single crystal body is stable up to a melting temperature of the sintered body higher than 1700° C. in an oxygen-containing atmosphere.

10. A Sr—Ru conductive oxide comprising a sintered body made from a mixture of a powdered $SrCO_3$, $RuO_2$ and a Ru metal, wherein the sintered body is stable up to a melting temperature of the sintered body higher than 1700° C. in an oxygen-containing atmosphere.

11. A heating element formed of a Sr—Ru conductive oxide comprising a sintered body made from a mixture of a powdered $SrCO_3$, and $RuO_2$, wherein the sintered body is stable up to a melting temperature of the sintered body higher than 1700° C. in an oxygen-containing atmosphere.

12. An electrode formed of a poly crystalline Sr—Ru conductive oxide comprising a sintered body made from a mixture of a powdered $SrCO_3$, and $RuO_2$, wherein the sintered body is stable up to a melting temperature of the sintered body higher than 1700° C. in an oxygen-containing atmosphere.

13. A thermocouple formed of a Sr—Ru conductive oxide comprising a sintered body made from a mixture of a powdered $SrCO_3$, and $RuO_2$, wherein the sintered body is stable up to a melting temperature of the sintered body higher than 1700° C. in an oxygen-containing atmosphere.

14. A light-emitter formed of a Sr—Ru conductive oxide comprising a sintered body made from a mixture of a powdered $SrCO_3$, and $RuO_2$, wherein the sintered body is stable up to a melting temperature of the sintered body higher than 1700° C. in an oxygen-containing atmosphere.

15. A Sr—Ru conductive oxide comprising a single crystal body grown from a melt of a sintered body of Sr—Ru conductive oxide made from a mixture of a powdered $SrCO_3$, $RuO_2$ and an Ru metal, wherein the single crystal body is stable up to a melting temperature of the sintered body higher than 1700° C. in an oxygen-containing atmosphere.

16. A heating element formed of a Sr—Ru conductive oxide comprising a single crystal body grown from a melt of a sintered body of Sr—Ru conductive oxide made from a mixture of a powdered $SrCO_3$, and $RuO_2$, wherein the single crystal body is stable up to a melting temperature of the sintered body higher than 1700° C. in an oxygen-containing atmosphere.

17. A thermocouple formed of a Sr—Ru conductive oxide comprising a single crystal body grown from a melt of a sintered body of Sr—Ru conductive oxide made from a mixture of a powdered $SrCO_3$, and $RuO_2$, wherein the single crystal body is stable up to a melting temperature of the sintered body higher than 1700° C. in an oxygen-containing atmosphere.

18. A light emitter formed of a Sr—Ru conductive oxide comprising a single crystal body grown from a melt of a sintered body of Sr—Ru conductive oxide made from a mixture of a powdered $SrCO_3$, and $RuO_2$, wherein the single crystal body is stable up to a melting temperature of the sintered body higher than 1700° C. in an oxygen-containing atmosphere.

* * * * *